United States Patent [19]

Iwama et al.

[11] 3,902,906

[45] Sept. 2, 1975

[54] PHOTOSENSITIVE MATERIAL WITH QUINONE DIAZIDE MOIETY CONTAINING POLYMER

[75] Inventors: Hideaki Iwama, Tachikawa; Noriyasu Kita, Musashimurayama; Keiichi Yumiki, Hino; Hiroo Kawada, Tokyo; Hiroyoshi Yamaguchi, Higashimurayama, all of Japan

[73] Assignee: Konishiroku Photo Industry Co., Ltd., Tokyo, Japan

[22] Filed: Oct. 10, 1973

[21] Appl. No.: 405,106

[30] Foreign Application Priority Data

Oct. 17, 1972 Japan ............................ 47-103216

[52] U.S. Cl. .................... 96/115 R; 96/33; 96/35.1; 96/36; 96/36.2; 96/36.3; 96/49; 96/75; 96/91 D; 96/91 N; 96/86 P; 96/87 R; 260/141; 204/159.14; 204/159.16; 204/159.17

[51] Int. Cl.$^2$ .......................................... G03F 7/08

[58] Field of Search ....................... 96/91 D, 115 R; 204/159.14, 159.16, 159.17; 260/141

[56] References Cited

UNITED STATES PATENTS

| | | | |
|---|---|---|---|
| 3,046,110 | 7/1962 | Schmidt | 96/91 D X |
| 3,106,465 | 10/1963 | Neugebauer et al. | 96/91 D X |
| 3,201,239 | 8/1965 | Neugebauer et al. | 96/91 D X |
| 3,502,470 | 3/1970 | Delzenne et al. | 96/91 D X |
| 3,533,796 | 10/1970 | Lassig | 96/91 D |
| 3,579,343 | 5/1971 | Kogure et al. | 96/115 R |
| 3,644,118 | 2/1972 | Agnihotri | 96/91 D X |
| 3,647,443 | 3/1972 | Rauner et al. | 96/91 D X |
| 3,687,663 | 8/1972 | Bloom | 96/91 D X |
| 3,759,711 | 9/1973 | Rauner et al. | 96/91 D X |

FOREIGN PATENTS OR APPLICATIONS

| | | | |
|---|---|---|---|
| 699,413 | 11/1953 | United Kingdom | 96/91 D |
| 1,267,005 | 3/1972 | United Kingdom | 96/91 D |

*Primary Examiner*—Charles L. Bowers, Jr.
*Attorney, Agent, or Firm*—Bierman & Bierman

[57] ABSTRACT

An improved photosensitive material is disclosed which comprises an addition polymer having a molecular weight of at least 5000 as a photosensitive component. The polymer comprises the following repeating monomer units [I] and [II]:

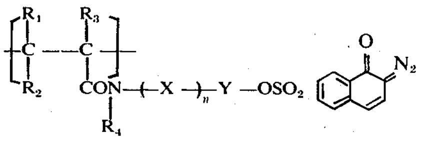

[I]

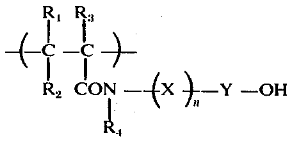

[II]

wherein $R_1$ and $R_2$ are individually hydrogen, alkyl or carboxylic acid; $R_3$ is hydrogen, halogen or alkyl; $R_4$ is hydrogen, alkyl, phenyl, or aralkyl; X is a divalent organic group selected from

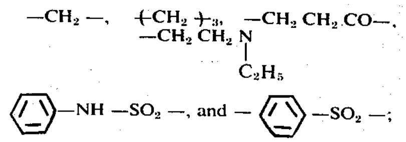

Y is unsubstituted phenylene or naphthylene, or phenylene or naphthylene having at least one of alkyl, nitro, carboxylic acid, cyano, sulfonic acid, hydroxyl, acyl, alkoxy or halogen; and $n$ is 0 or 1.

8 Claims, No Drawings

PHOTOSENSITIVE MATERIAL WITH QUINONE DIAZIDE MOIETY CONTAINING POLYMER

This invention relates to a photosensitive composition comprising a novel high polymer compound which decomposes under action of actinic rays to make a difference of the solubility between an exposed area and a non-exposed area. In the photomechanical process, there are usually employed photosensitive compositions comprising as a photosensitive component an o-naphthoquinone diazide sulfonic acid ester or an o-naphthoquinone diazide sulfonic acid amide. These o-naphthoquinone diazide sulfonic acid type compounds decompose under action of actinic rays to form carboxylic acid group-containing compounds and make a difference of the solubility between an exposed area and a non-exposed area. By virtue of such property, they are used as photosensitive compositions for formation of relief images. Namely, when an image wise exposure is conducted on a photosensitive material formed by applying a photosensitive composition comprising an o-naphtoquinone diazide sulfonic acid compound as a photosensitive component on a suitable support and the so exposed photosensitive material is developed with an aqiueous solution of an alkali or an organic solvent, such compound is dissolved away at the exposed area in the case of the former developer or at the non-exposed area in the case of the letter developer, and there can be obtained a relief image positive or negative to the original image used for the image wise exposure. The so obtained relief image is employed as an offset printing plate, an relief printing plate, a wash-off film, a name plate and the like. Further, it is also used for formation of a photogravure printing plate and a printed circuit substrate by employing such relief image as resist and quinone diazide sulfonic acid type compounds are not high polymer compounds, when they are used alone, a good film-forming property cannot be obtained. Further, they have a crystal-precipitating property. Moreover, they are insufficient in the mechanical strength required as printing resistance when used as a printing plate and in the chemical strength required as corrosion resistance when used as a resist. Therefore, when such compound alone is employed, a photosensitive composition of practical utility cannot be obtained.

Accordingly, such o-naphthoquinone diazide sulfonic acid compound is employed in the state mixed with, for instance, alkali-soluble resins such as rosin, shellac or phenol/formalin novolac resins and O- or m-cresol/formalin/novolac resins, or in the form of a resin prepared by condensing o-naphthoquinone diazide sulfonyl chloride with an o- or m-cresol/formalin/novolac resin to introduce an O-naphthoquinone diazide sulfonyl group in the resin. However, though relatively good film-forming property and storage stability can be attained in a photosensitive composition comprising such mixture or condensate of an o-naphthoquinone diazide sulfonic acid type compound with a resin, the mechanical strength and chemical strength of a relief image formed with use of such photosensitive composition is still insufficient, because the substrate resin is a resin of a relatively low molecular weight, such as a novolac type resin. Further, although, when the relief image is used as an alkali developer-treated positive type relief image, a practically satisfactory difference of the solubility is obtained between the exposed area and non-exposed area, a sufficient difference of the solubility cannot be obtained when it is used as a solvent developer-treated relief image.

It is therefore a primary object of this invention to provide a photosensitive composition which has a good film-forming property with no tendency to precipitate crystals and an excellent storage stability, exhibits a great difference of the solubility between an exposed area and a non-exposed area upon contact with either an aquious solution of an alkali or an organic solvent, provides a positive or negative relief image excellent in either the mechanical strength or chemical strength, and which has a high ink receptivity. We have found that the above object can be attained by a photosensitive composition comprising as a photosensitive component a high polymer compound have in the monomer the structural unit expressed by the following general formula (hereinafter referred to as "high polymer compound of this invention")

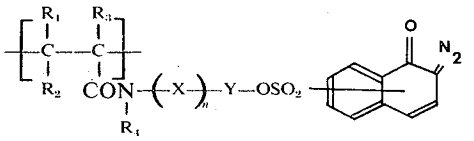

Wherein $R_1$ and $R_2$ are individually a hydrogen atom or an alkyl or carboxylic acid group, $R_3$ is a hydrogen or halogen atom or an alkyl group, $R_4$ is a hydrogen atom or an alkyl, phenyl or aralkyl group, X is a divalent organic group connection the nitrogen atom to the carbon atom of the aromatic ring, *n* is 0 or 1, and Y is a phenylene or naphthylene group which may be substituted or unsubstituted.

The high polymer compound of this invention is characterized in that it has the structural units expressed by the above general formula in the molecule structure.

Namely, the high polymer compound of this invention includes homopolymers composed solely of the above structural unit and another structural unit included in the above formula as recurring units and copolymers comprising the above structural unit and another structural unit of a vinyl monomer, in which the unsaturated double bond is split. In the copolymer type high polymer compound of this invention, as the structural units to be combined with the expressed by the above general formula, there can be mentioned monomers having hydroxyl in place of o-naphthoquinone diazide sulphonyl in the above general formula and those of vinyl monomers in which the unsaturated double bond is cleft. As the vinyl monomer, there can be mentioned, for instance, unsaturated olefins such as ethylene, propylene, butylene, isobutylene and butadiene; styrene type monomers such as styrene, α-methylstyrene and p-chlor-styrene; acrylic acid; methacrylic acid; itaconic acid; maleic acid; maleic anhydride; α-methylene aliphatic monocarboxylic acid esters such as methyl acrylate, n-butyl acrylate, isobutyl acrylate, dodecyl acrylate, n-octyl acrylate, 2-chloroethyl acrylate, phenyl acrylate, methyl α-chloroacrylate, methyl methacrylate, ethyl methacrylate, butyl methacrylate and ethyl ethacrylate; acrylonitrile; methacrylonitrile; acrylamide; methacrylamide; α-ethylacrylamide; acrylanilide; p-chloroacrylanilide; m-nitroacrylanilide; m-methoxyacrylanilide; vinyl ethers such as vinyl methyl ether, vinyl ethyl ether and vinyl isobutyl ether; vinyl esters such as vinyl chloride, vinyl acetate, vinyl propionate, vinyl benzoate and vinyl butyrate; vinyliden chloride; vinyl acetate, vinyl propionate, vinyl benzoate and vinyl butyrate; vinyliden chloride; vinylidene cyanide; ethylene derivatives such as 1-methyl-1'-methoxyethylene, 1,1'-dimethoxyethylene, 1,2-dimethoxyethylene, 1,1'-dimethoxycarbonyl ethylene and 1-methyl-1'-nitroethylenes; and N-vinyl compounds such as N-vinylpyrrole, N-vinylcarbazole, N-vinylindole. N-vinylpyrrolidine and N-vinylpyrrolidone. In the structural units of the high polymer compound of this invention expressed by the above general formula, Y stands for a phenylene or naphthylene group which may be substituted or unsubstituted. Since the characteristic properties of the high polymer compound of this invention are hardly influenced by the kind of the substituted on the group Y, an optional group can be used as a substituent. For instance, as typical substituents there can be mentioned an alkyl group, an alkoxy group, a halogen atom, an acyl group, a hydroxyl group, a carboxylic acid group, a sulfonic acid group, a cyano group, a nitro group and the like. Typical instances of the high polymer compound of this invention will now be illustrated. In these compounds, $\overline{M}n$ is an average molecular weight, and *l*: *m* : *n* or *m* ; *n* is the mole ratio among the structural units.

(1)

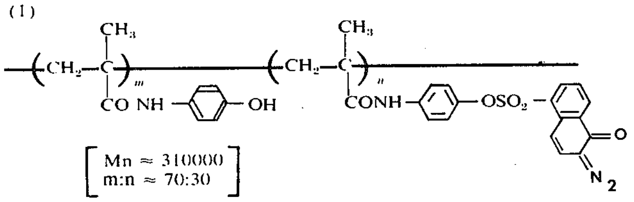

[Mn ≈ 310000, m:n ≈ 70:30]

(2)

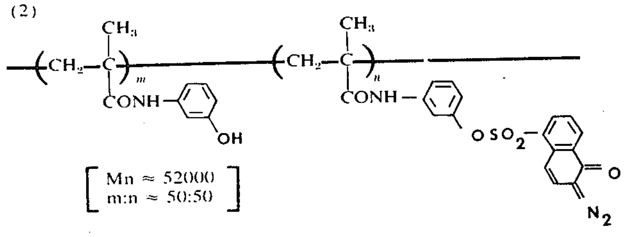

[Mn ≈ 52000, m:n ≈ 50:50]

(3)

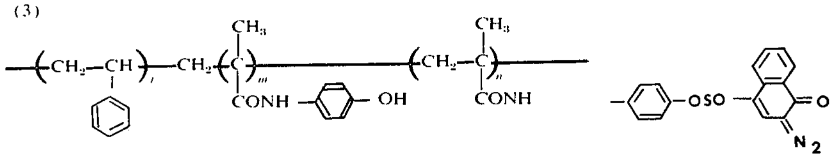

[Mn ≈ 54000, l:m:n ≈ 22:55:23]

(4)

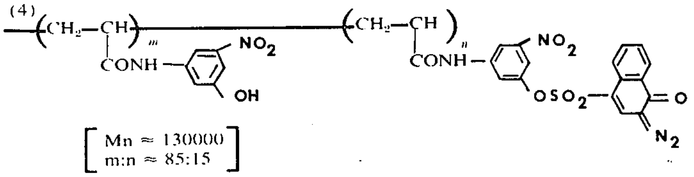

[Mn ≈ 130000, m:n ≈ 85:15]

(5)

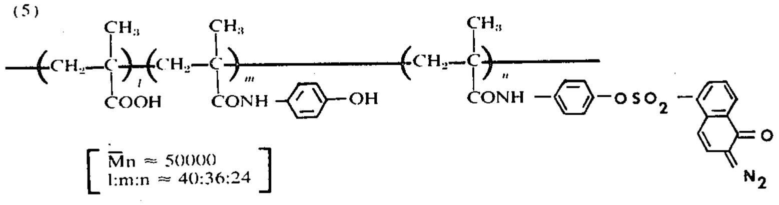

[$\overline{M}n$ ≈ 50000, l:m:n ≈ 40:36:24]

(6)

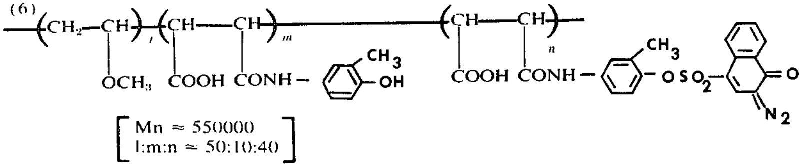

[Mn ≈ 550000, l:m:n ≈ 50:10:40]

(7)
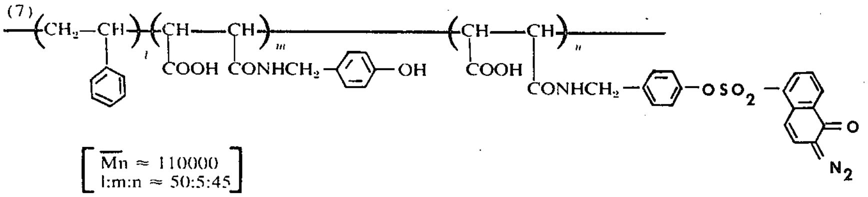
[ $\overline{Mn} \approx 110000$
l:m:n ≈ 50:5:45 ]
(8)
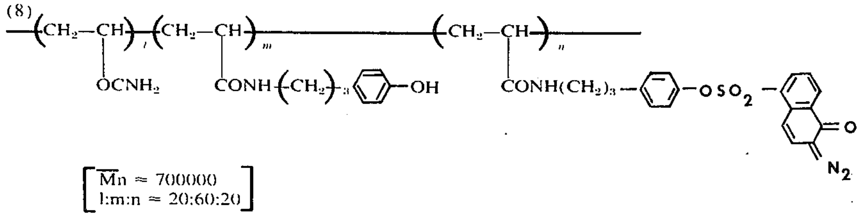
[ $\overline{Mn} \approx 700000$
l:m:n ≈ 20:60:20 ]
(9)
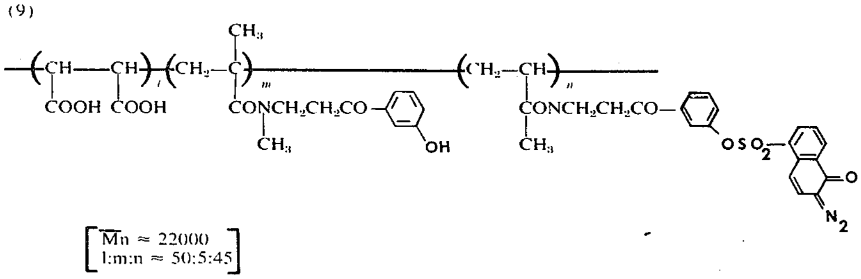
[ $\overline{Mn} \approx 22000$
l:m:n ≈ 50:5:45 ]
(10)
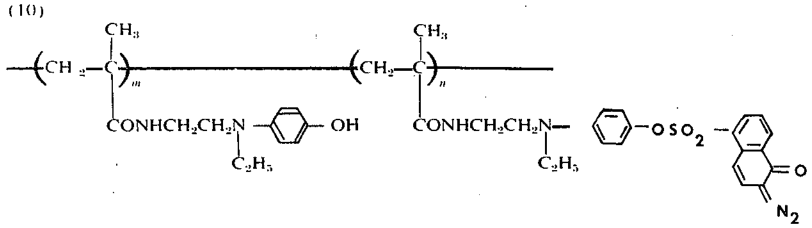
[ $\overline{Mn} \approx 9500$
m:n ≈ 80:20 ]
(11)
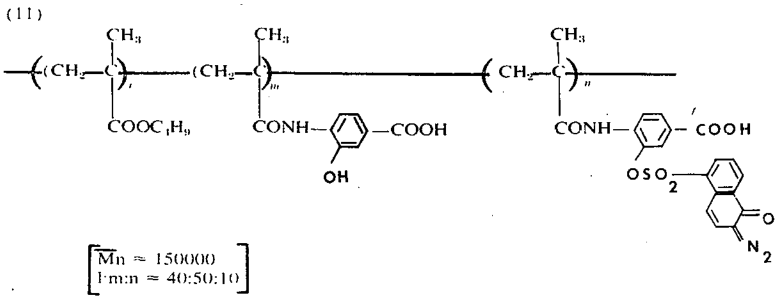
[ $\overline{Mn} \approx 150000$
l:m:n ≈ 40:50:10 ]
(12)
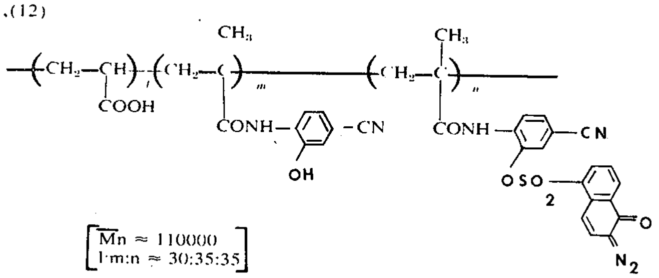
[ $\overline{Mn} \approx 110000$
l:m:n ≈ 30:35:35 ]

(13)
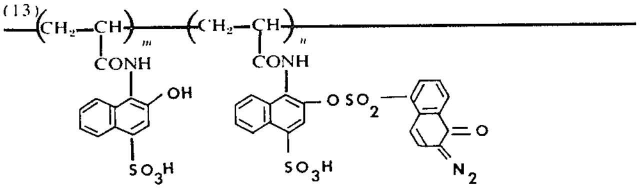
[Mn ≈ 53000
m:n ≈ 40:60]
(14)
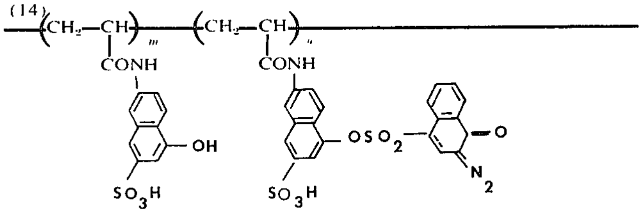
[Mn ≈ 32000
m:n ≈ 30:70]
(15)
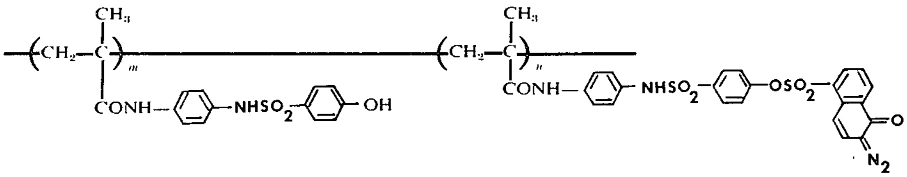
[Mn ≈ 5000
m:n ≈ 80:20]
(16)
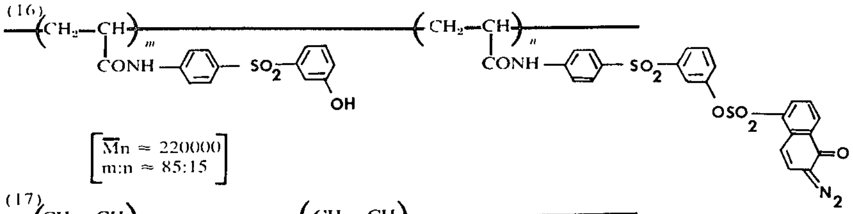
[Mn ≈ 220000
m:n ≈ 85:15]
(17)
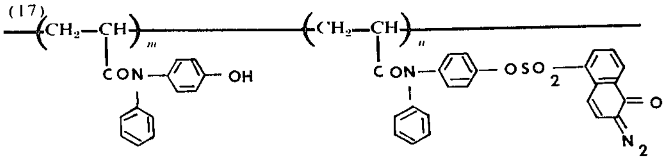
[Mn ≈ 140000
m:n ≈ 70:30]
(18)
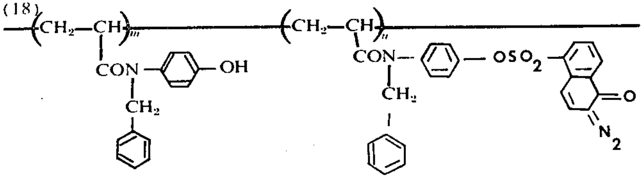
[Mn ≈ 9500
m:n ≈ 70:30]
(19)
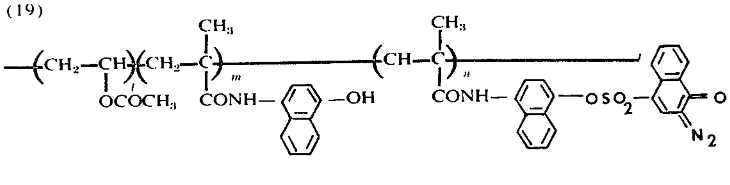
[Mn ≈ 120000
l:m:n ≈ 30:50:20]

(20)

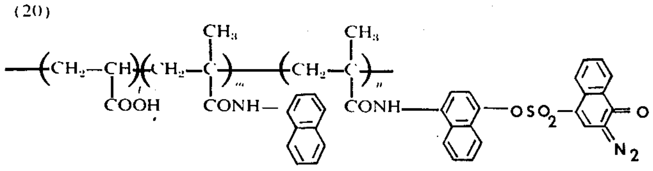

[$\overline{Mn}$ ≈ 26600
l:m:n ≈ 20:48:32]

(21)

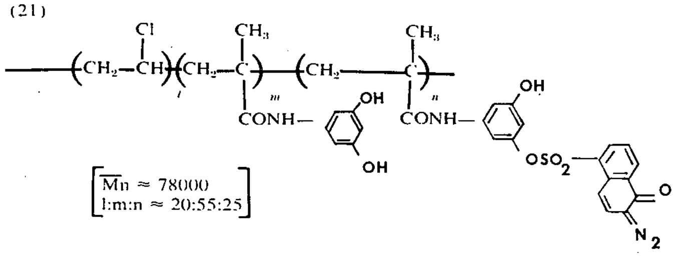

[$\overline{Mn}$ ≈ 78000
l:m:n ≈ 20:55:25]

(22)

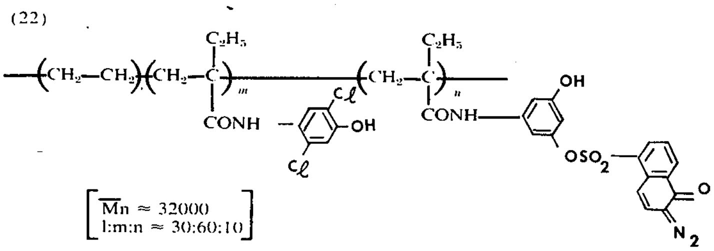

[$\overline{Mn}$ ≈ 32000
l:m:n ≈ 30:60:10]

(23)

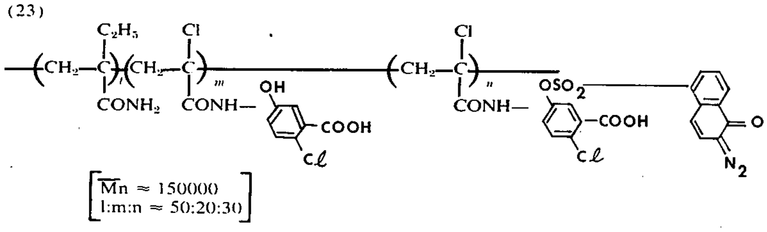

[$\overline{Mn}$ ≈ 150000
l:m:n ≈ 50:20:30]

(24)

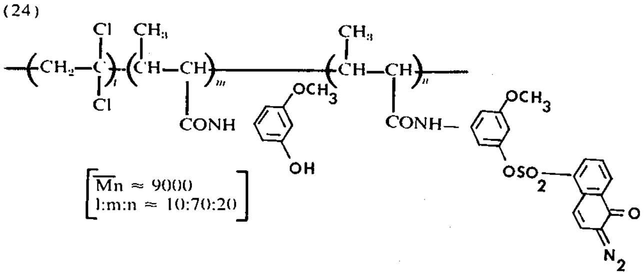

[$\overline{Mn}$ ≈ 9000
l:m:n ≈ 10:70:20]

The high polymer compound of this invention can be synthesized by various methods. For instance, the high polymer compound of this invention can be obtained by a method comprising reacting an α,β-unsaturated acid chloride or α,β-unsaturated acid anhydride with a primary or secondary amine having a phenolic hydroxyl group, if necessary, in the presence of a basic catalyst to form a monomer having a structure corresponding to one in which the o-naphthoquinone diazide sulfonoxy group of the above general formula is replaced by a hydroxyl group, homopolymerizing said monomer or copolymerizing said monomer with at least one vinyl monomer according to customary precedures to obtain a macromolecular compound having a phenolic hydroxyl group, and condensing the so-obtained macromolecular compound with o-naphthoquinone diazide sulfonyl chloride in the presence of an alkali in a water-miscible organic solvent to thereby introduce the o-naphthoquinone diazide sulfonoxy group at the position of the hydroxyl group and obtain the intended macromolecular compound. The high polymer compound of this invention can also be synthesized by a method comprising preparing a monomer having a structure corresponding to one in which the o-naphthoquinone diazide sulfonoxy group of the above general formula is replaced by a hydroxyl group, in the same manner as in the above method, condensing said monomer with o-naphtho-quinone diazide sulfonyl chloride in the presence of an alkali in a water miscible solvent to form a monomer corresponding to the structural unit expressed by the above general formula, and hompolymerizing the resulting monomer or copolymerizing it with at least one vinyl monomer according to know proceduresds In the latter method, partial decomposition of the o-naphthoquinone diazide nucleus sometimes occurs during polymeriazation. Therefore, the former method is preferred as the synthesis method.

In each synthesis emthod, the molecular weight of the high polymer compound of this invention can be adjusted relatively easily in a broad range by choosing appropriately the polymerization temperature, the kind of the polymerization initiator and other polymerization conditions. Further, in condensation with o-naphthoquinone diazide sulfonyl chloride, molar fraction of the structural units expressed by the above general formula in the macromolecular compound of this invention can be optionally adjusted by controlling the amount of o-naphthoquinone diazide sulfonyl chloride and choosing the amount and kind of the reaction solvent appropriately.

Especially in the case of condensation of a phenolic hydroxyl group-containing homopolymer or copolymer with o-naphthoquinone diazide sulfonyl chloride, when tetraphydrofuran incorporated with about 5 to about 10% of water is employed as the reaction solvent, the homopolymer or copolymer is sufficiently dissolved in the solvent and condensation proceeds very smoothly, and the ratio of condensation of o-naphthoquinone diazide sulfonyl chloride can be extremely heightened as compared with the case where other reaction solvent, e.g., γ-butyrolactone is employed. Therefore, in such case, the phenolic hydroxyl group of the homopolymer or copolymer can be completely substituted by the o-naphthoquinone diazide sulfonyl group.

As mentioned above, in high polymer compound of this invention, either the molecular weight or the molar fraction of the structural unit expressed by the above general formula can be optionally changed in a broad range. However, in order to apply the high polymer compound to the intended use effectively, it is desired that the molecular weight of the high polymer compound of this invention is about 5,000 to 100,000 and the molar fraction of the structural unit expressed by the above general formula is at least 5 mole % referably 5–70 mole %.

Typical instances of the high polymer compound of this invention will now be illustrated by way of synthesis examples.

SYNTHESIS EXAMPLE 1

Synthesis of Compound (1)

400 g of γ-hydroxyaniline, 4 g of hydroquinone monomethyl ether, 4 l of acetone and 300 g of pyridine were mixed together, and the mixture was cooled from the outside with use of a freezing mixture. When the inside temperature gone down to − 10°C. 420 g of methacryl chloride was added dropwise to the above mixture under stirration.

The dropping rate was adjusted so that the reaction temperature was maintained below 0°C. After completion of the dropwise addition, the mixture was stirred at 0° to 3°C. for about 2 hours, and then it was further stirred at 25°C. for 2 hours. Then, the resulting reaction mixture was condensed until its volume was reduced to about one-third, and the concentrate was poured into 10 l of dilute hydrochloric acid (pH = about 1.0). The resulting precipitate was suction filtered to obtain a white solid. This white solid was dissolved under heating in 2 l of methanol, and 2 l of 5 % sodium carbonate was added to the solution and the mixture was stirred at 40°C. for 30 minutes.

The resulting dark red solution was poured into 8 l of a 5 % aqueous solution of hydrochloric acid to form a large quantity of a precipitate, which was recovered by suction filtration and dried to obtain a light pink solid.

Recrystallization of this solid from a mixed solvent of ethanol and water gave 450 g of white crystals of p-hydrorymethacryl anilide. 124 g of so obtained p-hydroxiymethacryl anilide and 164 mg of α.α'-azobisisobutyronitrile were dissolved in 1 : 1 mixed solvent of acetone and methanol, and heated at 65°C. for 30 minutes in a sealed tube, the inside atomosphere of which had been substituted by nitrogen gas, to thereby form a polymer solution. This polymer solution was diluted with 150 ml of methanol, the dilution was poured into water, and the resulting white precipitate was recovered by filtration and dried to obtain 101 g of a white polymer (A). The molecular wight of this polymer (A) was about 250,000 as measured according to the osmotic pressure method. 20 g of this white polymer (A) and 15.2 f fp o-naphthoquinone-diazide-5-sulfonyl chloride were dissolved in a mixed solvent of 400 ml of γ-butyrolactone and 10 ml of water. 100 m of a 5 % solution of sodium carbonate was added drowise to the soution at 40°C. under stirring. After completion of the dropwise addition, the reaction liquor was stirred for 30 minutes and poured into 2 l of dilute hydrochloric acid (PH=1–3) to form a precipitate. The resulting yellow precipitate was recovered by filtration. washed with methanol and then with ethyl acetate sufficiently, and dried to obtain 27 g of the compound (1) shown hereinabove.

SYNTHESIS EXAMPLE 2

Synthesis of Compound (2)

104 g of m-hydroxyailine, 0.5 g of hydroquinone monomethyl ether, 170 g of methacrylic anhydride and 200 ml of water were mixed together, and they were reacted at 70°C. for 2 hours. The reaction mixture was cooled and 5 % hydrochloric acid was added thereto.

The resulting precipitate was recovered by suction filtration to obtain a white solid. This white solid was dissolved under heating in 500 ml of 5 % sodium carbonate was added to the solution. The mixture was stirred at 40°C. for 30 minutes and poured into 2 l of 5 % hydrochloric acid, and a large quantity of the resulting precipitate was recovered by suction filtration. Recrystallization from ethanol gave 130 g of white crystals of m-hydroxymethacryl anilide melting at 171° to 173°C. 124 g of so obtained m-hydroxymethacryl anilide and 1.15 g of α,α'-azobisisobutyronitrile were dissolved in 350 ml of a 1:1 mixed solvent of acetone and methanol, and heated at 65°C. for 30 hours in a sealed tube, the inside atmosphere of which had been substituted by nitrogen gas, to thereby obtain a polymer solution.

This polymer solution was diluted with 200 ml of a 1:1 mixed solvent of methanol and acetone, and the dilution was poured into water. The resulting white precipitate was recovered by filtration and dried to obtain 121 g of a white polymer (B) having a molecular weight of about 45,000 as measured according to the osmotic method.

20 g of this white polymer (B) and 30 g of o-naphthoquinone-diazide-5-sulfonyl chloride were dissolved in a mixed solvent of 600 ml of γ-butyrolactone and 10 ml of water, and 200 ml of a 5 % solution of sodium carbonate was added dropwise to the solution under stirring at 40°C. After completion of the dropwise addition, the reaction liquor was agitated for 30 minutes and poured into 3 l of dilute hydrochloric acid (PH=10- 3) to cause precipitation. The resulting yellow precipitate was recovered by filtration, washed with methanol and then with ethyl acetate, and dried to obtain 33 g of the compound (2) shown hereinabove.

SYNTHESIS EXAMPLE 3

Synthesis of Compound (20)

227 g of 5-amino-αnaphthol, 19 g of hydroquinone monomethyl ether and 2 l of pyridine were mixed together, and the mixture was cooled to −10°C. with use of a coolant. 110 g of methacryl chloride was added dropwise to the above mixture under agitation, and after completion of the dropwise addition, the mixture was stirred at 0° to 2°C. for 2 hours and at 25°C. for 2 hours. Then, the reaction liquor was poured into 20 l of ice water to cause pricipitation, and the resulting precipitate was recovered by filtration, washed with water and dried. The resulting solid was added to 2 l of a 1:1 mixed solution of methanol and 5 % sodium carbonate, and the mixture was agitated at 40°C. and poured in 4 l of 5 % hydrochloric acid to form a large quantity of a precipitate. The precipitate was recovered by suction filtration, and recrystallization from ethanol gave 210 g of N-(5-hydroxy-α-naphthyl)methacrylamide melting at 223°–224°C.

182 g (0.8 mole) of so obtained N-(5-hydroxy-α-naphthyl)methacrylamide, 14.4 g(0.2 mole) of acrylic acid, 1.64 g of α,α'-azobisisobutyronitrile and 2.02 g of dodecylmercaptol were mixed together, and the mixture was dissolved in 600 ml of a 1:1 mixed solvent of acetone and methanol, and heated at 65°C. for 40 hours in a sealed tube, the inside atmosphere of which had been replaced by nitrogen gas, to thereby obtain a copolymer solution. The so formed copolymer solution was diluted with 200 ml of methanol, and the dilution was poured into water. The resulting precipitate was recovered by filtration and dried to obtain 192 g of a copolymer (C) having a molecular weight of about 19,000 as measured according to the osmotic method. 20 g of this copolymer (CO and 23 g of o-naphthoquinone-diazide-5-sulfonyl chloride were dissolved in a mixed solvent of 500 ml of γ-butyrolactone and 10 ml of water, and 150 ml of a 5 % solution of sodium carbonate was added dropwise to the solution under agiation at 40°C. After completion of the dropwise addition, the mixture was agitated for 30 minutes and poured into 2 l of dilute hydrochloric acid to cause precipitation.

The resulting precipitate was recovered by filtration, washed with methanol and then with ethyl acetate, and dried to obtain 28 g of the compound (20) shown hereinabove.

SYNTHESIS EXAMPLE 4

Synthesis of Compound (3)

9.6 g ( 0.45 mole ) of p-hydroxymethacryl anilide obtained in Synthesis Example 1, 13 g (0.125 mole ) of styrene and 935 mg of α,α'-azobisisobutyronitrile were dissolved in 250 ml of a 1:1 mixed solvent of dioxane and methanol and heated at 65°C. for 30 hours in a sealed tube, the inside atmosphere of which had been substituted by nitrogen gas, to therby form a copolymer solution. The so obtained copolymer solution was diluted with 150 ml of methanol, and the dilution was thrown into water to cause precipitation. The resulting precipitate was recovered by filtration and dried to obtain 90 g of a copolymer (D) having a molecular weight of about 41,000 as measured according to the osmotic method.

20 g of so formed copolymer (D) and 15.2 g of o-naphthoquinone-diazide-5-sulfonyl chloride were dissolved in a mixed solvent of 4000 ml of tetrahydrofuran and 10 ml of water, and 80 ml of a 5 % solution of sodium carbonate was added dropwise to the solution at 45°C. under agitation. After completion of the dropwise addition, the reaction liquor was agitated for 15 minutes and poured into 3 l of dilute hydrochloric acid to cause precipitation. The resulting precipitate was recovered by filtration, washed with methanol and then the ehyl acetate and dried to obtain 27 g of the compound (3) shown above.

SYNTHESIS EXAMPLE 5

Synthesis of Compound (5)

106.2 g ( 0.6 mole ) of p-hydroxymethacryl anilide obtained in Synthesis Example 1, 34.4 g (0.4 mole) of methacrylic acid and 1.64 g of α,α'-azobisisobutyronitrile were dissolved in 350 ml of a 1:1 mixed solvent of acetone and methanol and heated at 65°C. for 30 hours in a sealed tube, the inside atomosphere of which had been replaced by nitrogen gas, to thereby form a copolymer solution.

This copolymer solution was diluted with 100 ml of methanol and poured into water to cause precipitation. The resulting precipitate was recovered by filtration and dried to obtain 130 g of a copolymer (E) having a molecular weight of 38,000 as measured according to the osmotic method. 14 g of the so formed copolymer (E) and 16.1 g of o-naphthoquinone-diazide-5-sulfonyl chloride were dissolved in 400 ml of methyl cellosolve, and 110 ml of a 5% solution of sodium carbonate was added dropwise to the above solution at 40°C. under agitation. After completion of the dropqise addition, the reaction liquor was further agitated for 15 minutes and poured into 2 l of dilute hydrochloric acid to cause precipitation. The resulting precipitate was recovered by filtration, washed with methanol and then with ethyl acetate, and dried to obtain 25 g of the compound (5) shown hereinabove. The high polymer compound of this invention synthesized according to the foregoing procedures has a photosensitivity and therefore, it must be stored in the dark.

This compound does not decompose when kept in the dark and it can be stored for a long time.

Further, this compound is characterized by a very low moisture-absorbing property. Thus, the high polymer compound can retain properties required of the photosensitive material in good conditions even when it is stored for a long time.

This invention relates to a photosensitive composition comprising as the photosensitive component at least one of such high polymer compounds having the above-mentioned photosensitive characteristics.

Since the high polymer compound of this invention is a resin having a high molecular weight, it has a very excellent film-forming property and does not cause precipitation of crystals. Furthermore, it is excellent in storage stability and adhesiveness.

Accordingly, even when the high polymer compound of this invention alone is dissolved in an organic solvent, a good photosensitive composition can be obtained. In order to improve the coating processability of the photosensitive composition, it is possible to employ another resin in combination with the high polymer compound of this invention. For instance, in the case of a photosensitive composition for formation of a positive relief image, an alkali-soluble resin is mainly employed, and in the case of a photosensitive composition for formation of negative relief image, an organic solvent-soluble resin is employed in combination with the macromolecular compound of this invention.

As such alkali-soluble resin, there can be mentioned natural resins such as rosin and shellac, novolac resins such as phenol/formalin/novolac resins and m-xylenol/formalin/novolac resins, homopolymers and copolymers of unsaturated carboxylic acids such as polyacrylic acid, polymethacrylic acid, methacrylic acid/styrene copolymers, methacrylic acid/methyl methacrylate copolymers, maleic anhydride/vinyl compound copolymers, acrylic acid/vinyl compound copolymers and methacrylic acid/viny compound copolymers, resins obtained by partially acetalizing a partially or completely saponified product of polyvinyl acetate with an aldehyde such as acetaldehyde, benzaldehyde, hydroxybenzaldehyde and carbomethoxybenzaldehyde, and homopolymers of a monomer corresponding to the above structural unit expressed by the above general formula in which the o-naphthoquinone diazide sulfonyl group is replaced by a hydroxyl group and copolymers of such monomer with other vinyl monomer.

As the organic solvent-soluble resin, there can be mentioned, for instance, cellulose alkyl ethers such as cellulose methyl ether and cellulose ethyl ether.

The high polymer compound of this invention has a good compatibility with these resins, and therefore, these resins can be used effectively in combination with the high polymer compound of this invention.

Since a cellulose alkyl ether is especially effective for improving the coating processability, good results can be obtained when a small amount of a cellulose alkyl ether is incorporated in a positive-type photosensitive composition to be developed with an alkali. The photosensitive composition of this invention can be comprise as another photosensitive component a known o-naphthoquinone diazide type compound.

It is also possible to incorporate other various additives to the photosensitive composition of this invention. For instance, it is possible to add such dyes as acridine dyes, cyanine dyes, merocyanine dyes, styryl dyes and triphenylmethane dyes and pigments as colorants for visualizing images. In order to visualize an image upon light exposure, it is possible to add a photoluminescent or photometachromatic substance to the photosensitive composition of this invention.

As such photoluminescent or photometachromatic substance, there can be mentioned combinations of aromatic azides, carbonyl azides, sulfonyl azides or o-naphthequinonediazide-sulfonyl azides with leuco dyes.

Amounts added of these agents vary depending on the desired degree of visualization.

In general, sufficient results can be obtained when they are incorporated in amounts of 0.01 to 0.1 time the amount of the high polymer compound as the photosensitive component of the composition of this invention (on the weight basis).

Further, the above-mentioned alkali - soluble resin, organic solvent-soluble resin or known o-naphthoquinone diazide compound is generally added in an amount 0.1 to 10 times the amount of the high polymer compound of this invention on the weight basis.

The photosensitive composition of this invention is coated on a suitable support such as an aluminum plate, a zinc plate, copper plate, a plastic film, paper or a laminate plate, e.g., bimetal or trimetal, and then dried. Thus, it is applied to various uses. It is desired that the coating liquor has such a composition that the amount of the total solids in the photosensition composition is 0.1 to 50 % by weight based on the organic solvent. Suitable solvents to be used include methyl cellosolve, ethyl cellosolve dioxane, acetone, cyclohexanone, γ-butyrolactone, tetrachloroethane, tetrahydrofuran, dimethylsulfoxide, methyl cellosolve acetate and the like. The photosensitive composition of this invention is very stable and can be preserved for a long time when it is kept in the dark.

Further, a photosensitive material prepared by coating the photosensitive composition on a support can be preserved for more than several months when kept in the dark. The so formed photosensitive material can be used according to conventional methods.

For instance an original having a line image or screen image is exposed to light in the state adhering closely to the photosensitive face of the photosensitive material, and the development is conducted with use of an aqueous solution of an alkali, whereby a relief image positive to the original can be obtained.

A light source suitable for light exposure includes a carbon arc lamp, a mercury lamp, xenon lamp, a chemical lamp and a photographic flash lamp.

As the alkali aqueous solution to be used for the development, there can be mentioned, for instance, aqueous solutions of sodium hydroxide, potassium hydroxide, sodium carbonate, potassium carbonate, sodium hydrogen-carbonate, potassium hydrogencarbonate, sodium metasilicate, sodium secondary phosphate and sodium tertiary phosphate. In order to prevent fatigue of the liquid developer, it is possible to employ an alkaline buffer solution or an aliphatic amine such as mono-, di- or tri-hydroxyethylamine and mono-, di- or triethylamine according to need. The concentration of the aqueous solution of such alkali to be used as a developer varies depending on the kinds of the photosensitive composition and the alkali used, but in general, it is desired that the concentration is within a range of from 0.1 to 10 % by weight.

It is also possible to add a small amount of surface active agent, a water-miscible organic solvent or the like in order to accelerate the development or obviate nonuniform treatment. In case an organic solvent is used for development instead of the aqueous alkali solution, a relief image negative to the original can be obtained. As the organic solvent, there can be used effectively methanol, ethanol, acetone, benzene, toluene, acetonitrile, methylcellosolve, ethyl cellosolve, dioxane, tetrahydrofuran, methyl cellosolve acetate, methylethylketone, cyclohexanone, trichlene, -butyrolactone, dimethylformamide, dimethylsulfoxide, ethyl acetate, butyl acetate and mixed solvents of two or more of them.

In case a water-miscible organic solvent is used or a small amount of a surface active agent is employed in order to prevent swelling of the relief image or obviate non-uniform treatment, good results can be obtained by the use of a small amount of water.

The so obtained relief image has a high chemical resistance and exhibits a high resistance to an etching liquor comprising nitric acid or ferric chloride. Therefore, it can be used effectively for relief printing or a printing or for formation of name plates or printed circuit substates.

Further, since the relief image is excellent in ink receptivity, mechanical strength and adhesion to the support, it can also be used effectively as a pre-sensitized plate in planographic printing. Moreover, it has a good printing durability and it can endure printing for formation of a great number of prints.

The photosensitive composition of this invention has a good film-forming property without causing precepitation of crystals and gives a very great difference of the solubility between an exposed area and a non-exposed area in the case of either an aqueous solution of an alkali or an organic solvent. Therefore it can be used for formation of a relief image either positive or negative to the original. Further, in the synthesis of the macromolecular compound of this invention the molecular weight and the content of the structural unit having a photosensitive group can be adjusted relatively easily, and hence, when the macromolecular compound of this invention is employed, a photosensitive composition of this invention has high development latitude and sensitivity, and a relief photosensitive composition suitable for the intended use can be prepared conveniently.

Furthermore, a photosensitive material prepared with use of the photosensitive ocmposition of this invention has high development latitude and sensitivity, and a relief image formed with use of such photosensitive material is excellent in each of printing durability, abrasion resistance, adhesion to a support and chemical resistance and therefore, it can be applied effectively to various uses.

As detailed above, the photosensitive composition of this invention is very useful and valuable. This invention will now be illustrated by reference to Examples, which by no means limit the scope of this invention.

EXAMPLE 1

40 g of compound (1) obtained in Synthesis Example I was dissolved in 800 ml of a 1:1 mixed solvent of methyl cellosolve and cyclohexanone, and the solution was coated on a brush-grained aluminum plate by means of a whirler and dried. Then, a positive photo original having lines and screen were colosely sticked to the photosensitive face of the so obtained photosensitive plate, and light exposure was conducted for 1 minute by means of a mercury lamp of 3 KW disposed 1 m apart from the photosensitive plate. Then, the light-exposed plate was immersed in a 3 % aqueous solution of sodium metasilicate for 1 minute and the exposed surface was rubbed lightly with absorbent cotton. Thus, the coating of the photosensitive material was removed at the light-exposed area and a positive relief image excellent in the ink receptivity was obtained. When the so obtained relief image was given a water-retaining property by dampening solution and was used for printing by an offset printing by an offset printing machine, a great number of prints having a good image can be obtained.

EXAMPLE 2

10 g of compound (2) obtained in Synthesis Example 2,400 mg of cellulose ethyl ether and 100 mg of a triphenylmethane type dye (Victoria Pure Blue BOH manufactured by Hodogaya Chemical) were dissolved in 100 m of a 1:1 mixed solvent of dimethylformamide and methyl cellosolve, and the solution was coated on a surfacepolished printing plate of zind and the plate dried. A transparent film original was piled on the photosensitive face of the so obtained photosensitive plate and the assembly was set on a vacuum printer, and the light exposure was conducted for about 1 minute by means of a carbon arc lamp disposed 40 cm apart from the assembly. Then, development was carried out with use of a 1 % aqueous solution of sodium hydroxide and the photosensitive coating was removed at the light-exposed area, to thereby obtain a blue, positive relief image having a high acid resistance.

When the so obtained relief image was etched with an ordinary etching solution manufactured by Dow Chemical and subjected to printing by means of an relief printing machine, a great number of prints having a printed image of a clear contour could be obtained.

EXAMPLE 3

5 g of compound (2) obtained in Synthesis Example 2 and 150 mg of cellulose ethyl ether were dissolved in 100 ml of a 1:1 mixed solvent of dimethylf ormamide and methyl cellosolve, and the solution was coated on a brush-grained aluminum plate by means of a whirler dried.

A negative photo original having lines and screen was closely sticked to the photosensitive face of the so obtained photosensitive plate and light exposure was conducted for 5 minutes by means of a chemical lamp. Then, development was effected with a 10:4 mixed solvent of methyl cellosolve and γ-butyrolactone. The coating was removed at the non-exposed area nad a positive relief image was obtained, and the surface was adjusted with use of a 1 % aqueous solution of phosphoric acid. When printing was conducted by means of an offset printing machine, a great number of prints having a good image could be obtained.

EXAMPLE 4

10 g of compound (20) obtained in Synthesis Example 3,3 g of a phenol/formalin/novolak resin and 60mg of a triphenylmethane type dye (Victoria Blue Base F4R manufactured by BASF) were dissolved in a 1:4 mixed solvent of γ-butyrolactone and methyl cellosolve, and the solution was coated and dried on ordinary substrate for a printed circuit (laminate composed of a copper foil and a bakelite plate, phenol resin-coated paper or epoxy resin-coated paper).

A transparent positive film original was placed on the photosensitive face of the so obtained photosensitive plate, and the assembly was set on a vacuum printing frame. Thus, light exposure was conducted for 2 minutes by means of a mercury lamp of 3 KW at 200 V disposed about 90 cm apart from the assembly.

Then, development was carried out for 1 minute with use of a 2 % aqueous solution of sodium metasilicate and the developed plate was dried to obtain a positive relief image. Then, it was immersed in an aqueous solution containing 40 % by weight of ferric chloride to effect etching. After completion of the etching treatment to obtain a printed curcuit plate of good quality.

EXAMPLE 5

10 g of compound (3) obtained in Synthesis Example 4,2 g of naphthoquinone -(1,2)-diazide-(2)-5-sulfonylazide and 200 mg of 2-(p-dimethylaminosyryl) benzthiazole were dissolved in a 1:3 mixed solvent of $\gamma$-butyrolactone and cyclohexanone. The solution was coated and dried on a surface-roughened aluminum plate.

A transparent positive film original was placed on the photosensitive surface of the so obtained photosensitive plate and the assembly was set on a vacuum printing frame. Light exposure was conducted for 2 minutes by means of a tungsten lamp of 500 W to obtain a clear image of a concentrated red color.

Then, development was positive relief image excellent in fat sensitivity and mechanical strength.

When printing was conducted with use of the so obtained relief image by means of an offset printing machine, a great number of prints having a good image could be obtained.

EXAMPLE 6

7 g of compound (5) obtained in synthesis Example 5,500 mg of Victoria pure Blue BOH and 50 mg of cellulose ethyl ether were dissolved in a 1:1 mixed solvent of methyl cellosolve and cyclohexanone, and the solution was coated on a polyester film base and dried. A positive original was closely sticked on the photosensitive surface of the so obtained photosensitive film, and light exposure was conducted for 4 minutes by means of 3 mercury lamp of a 3 KW disposed 1 m apart form the photosensitive film.

Then, development was carried out with use of a 1 % aqueous solution of sodium tertiary phosphate to obtain a blue clear positive image. The resulting film was very suitable as a wash-off film useful for proof printing, television teletype, movie title, photo-type composing, instant lettering, type-tone, screen-tone and other various art techniques.

What is claimed is:

1. A photosensitive material comprising a support having a photosensitive composition, said composition comprising an addition polymer having a molecular weight of at least 5,000 as a ph otosensitive component, said polymer comprising, individually in an amount of at least 5%, repeating monomer units respectively represented by the following general formulas [I] and [II]

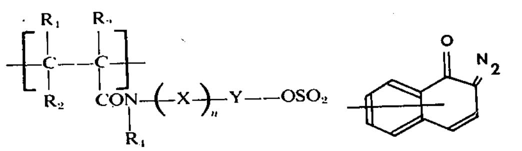
[I]

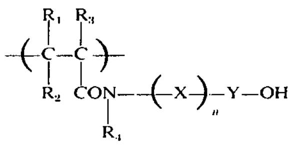
[II]

wherein $R_1$ and $R_2$ are individually hydrogen, alkyl or carboxylic acid; $R_3$ is hydrogen, halogen or alkyl; $R_4$ is hydrogen, alkyl, phenyl or aralkyl; X is a divalent organic group selected from

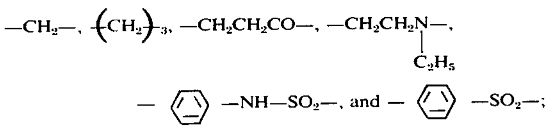

Y is unsubstituted phenylene or naphthylene, or phenylene or naphthylene having at least one of alkyl, nitro, carboxylic acid, cyano, sulfonic acid, hydroxyl, acyl, alkoxy or halogen; and *n* is 0 or 1.

2. A photosensitive material according to claim 1 wherein said addition polymer comprises said repeating monomer unit of the general formula [I] in an amount of 5 to 70 mole per cent and said repeating monomer unit of the general formula [II] in an amount of 5 to 85 mole per cent.

3. A photosensitive material according to claim 2 wherein said addition polymer is a copolymer of said repeating monomer unit of the general formula [I] and said repeating monomer unit of the general formula [II].

4. A photosensitive material according to claim 3 wherein $R_1$, $R_2$, and $R_4$ are hydrogen, *n* is 0, Y is phenyl, and $R_3$ is methyl

5. A photosensitive material according to claim 2 wherein said addition polymer is a copolymer of said repeating monomer unit of the general formula [I], said repeating monomer unit of the general formula [II], and of at least one other vinyl monomer.

6. A photosensitive material according to claim 5 wherein $R_1$, $R_2$ and $R_4$ are hydrogen, *n* is 0, Y is phenyl, and $R_3$ is methyl.

7. A photosensitive material according to claim 6 wherein said other vinyl monomer comprises styrene.

8. A photosensitive material according to claim 7 wherein said addition polymer is a copolymer of said repeating monomer units of the general formulas [I] and [II] and styrene.

* * * * *